(12) United States Patent
Kim et al.

(10) Patent No.: US 7,575,945 B2
(45) Date of Patent: Aug. 18, 2009

(54) METHOD OF FORMING A METAL LINE AND METHOD OF MANUFACTURING A DISPLAY SUBSTRATE BY USING THE SAME INCLUDING ETCHING AND UNDERCUTTING THE CHANNEL LAYER

(75) Inventors: Jang-Soo Kim, Suwon-si (KR); Sang-Gab Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 338 days.

(21) Appl. No.: 11/669,653

(22) Filed: Jan. 31, 2007

(65) Prior Publication Data

US 2007/0246845 A1    Oct. 25, 2007

(30) Foreign Application Priority Data

Apr. 24, 2006    (KR) .................... 10-2006-0036745

(51) Int. Cl.
*H01L 21/00* (2006.01)
*H01L 21/302* (2006.01)
*H01L 21/461* (2006.01)

(52) U.S. Cl. .................... 438/30; 438/739; 438/753
(58) Field of Classification Search .................. 438/30, 438/739, 753; 257/E27.131
See application file for complete search history.

(56) References Cited

U.S. PATENT DOCUMENTS

| | | | | |
|---|---|---|---|---|
| 5,728,592 A | * | 3/1998 | Oki et al. | 438/161 |
| 2007/0164330 A1 | * | 7/2007 | Jeong et al. | 257/291 |
| 2007/0249096 A1 | * | 10/2007 | Kim et al. | 438/118 |
| 2007/0249097 A1 | * | 10/2007 | Kim et al. | 438/118 |
| 2007/0249150 A1 | * | 10/2007 | Kim et al. | 438/597 |

* cited by examiner

*Primary Examiner*—William M. Brewster
(74) *Attorney, Agent, or Firm*—F. Chau & Associate

(57) ABSTRACT

In a method of forming a metal line and a method of manufacturing a display substrate, a channel layer and a metal layer are successively formed on a base substrate. A photoresist pattern is formed in a wiring area. The metal layer is etched by using the photoresist pattern to form a metal line. The photoresist pattern is removed by a predetermined thickness to form a residual photoresist pattern on the metal line. The channel layer is etched by using the metal line to form an undercut under the metal line. The protruding portion of the metal line is removed by using the residual photoresist pattern. The protruding portion relatively protrudes by formation of the undercut. Thus, an aperture ratio is increased, an after-image is prevented, and the display quality is improved.

21 Claims, 18 Drawing Sheets

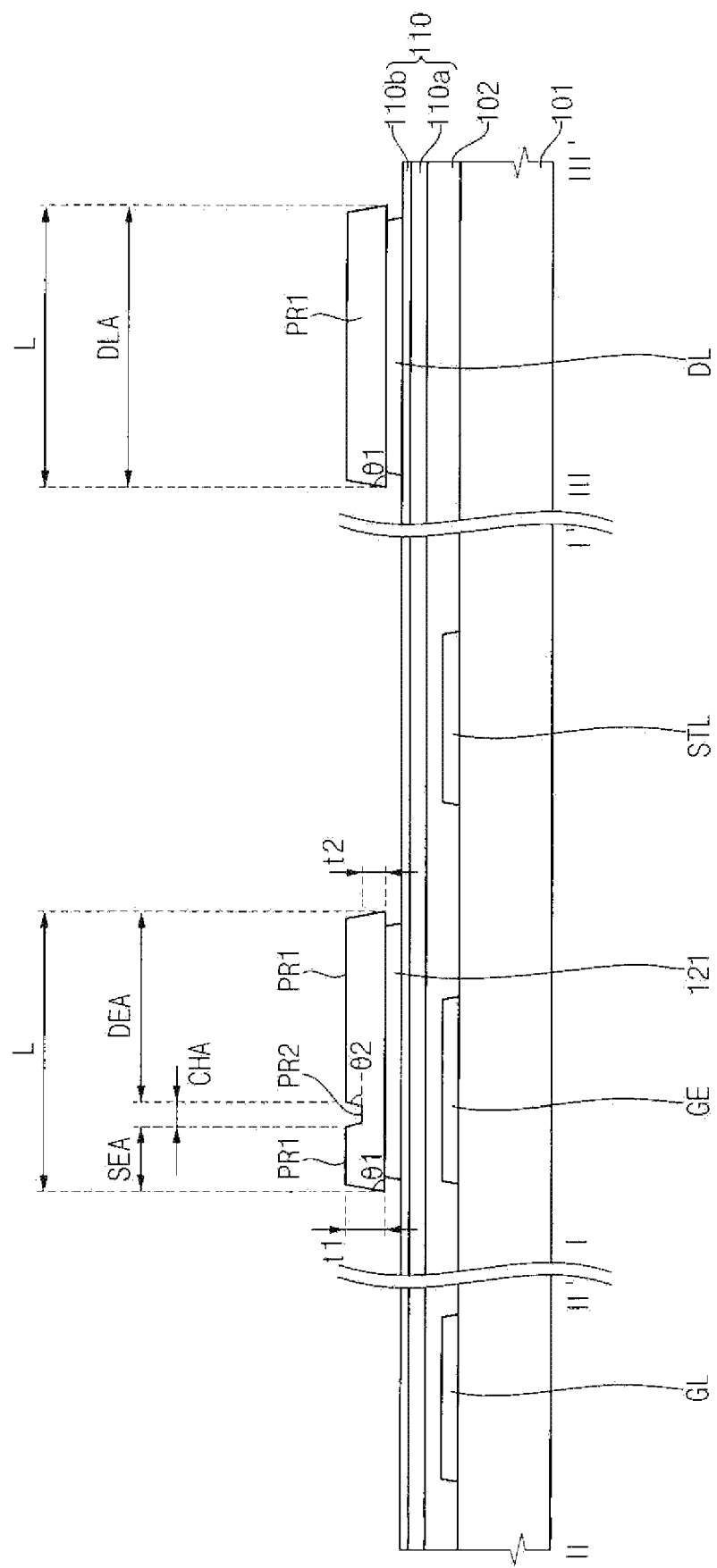

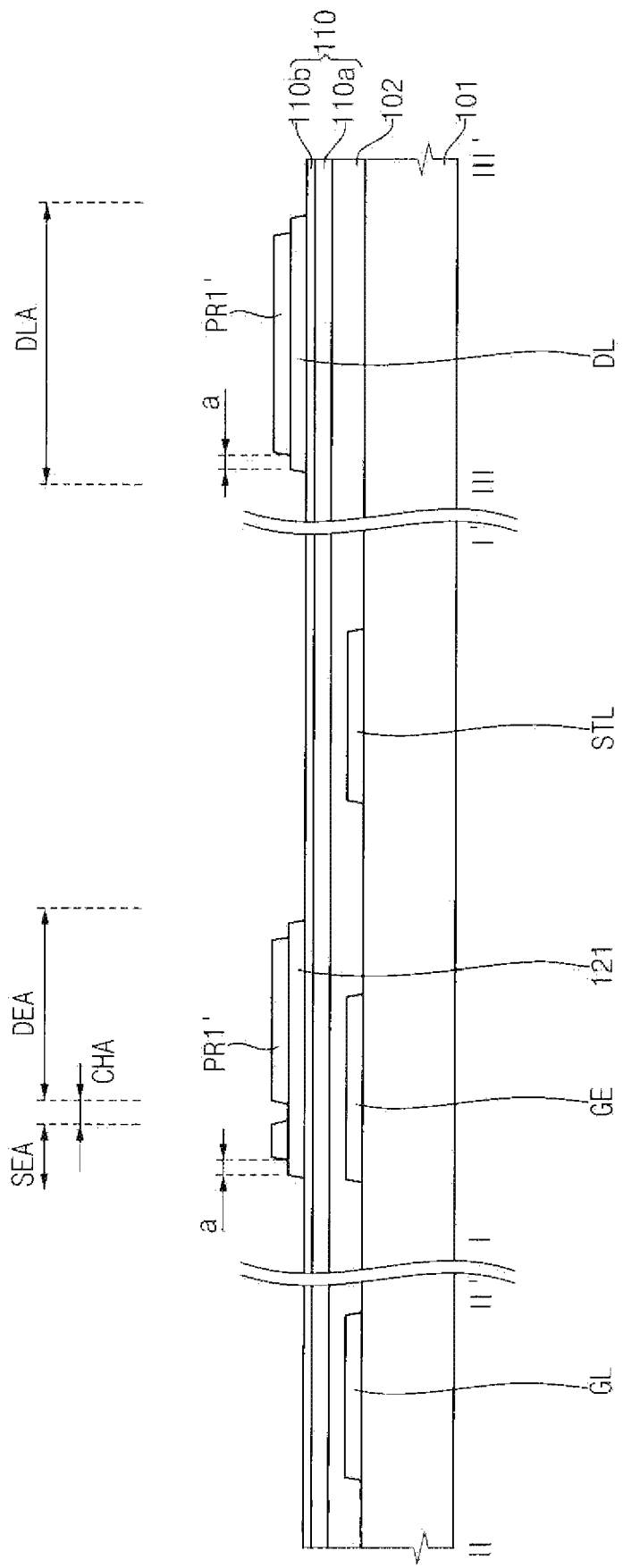

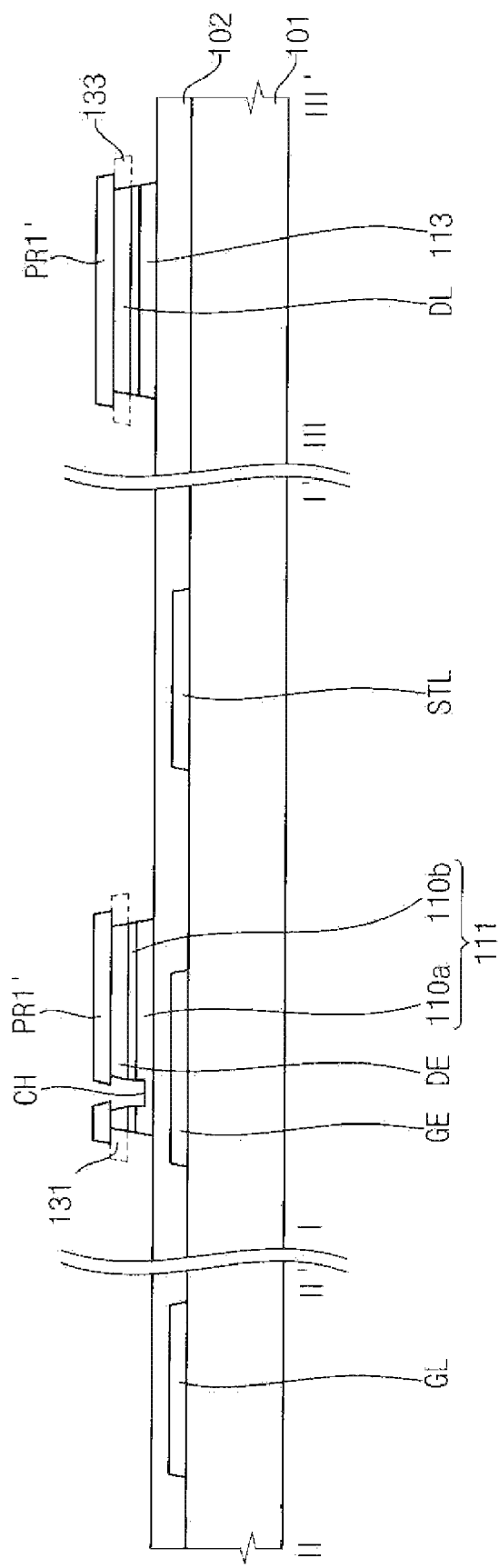

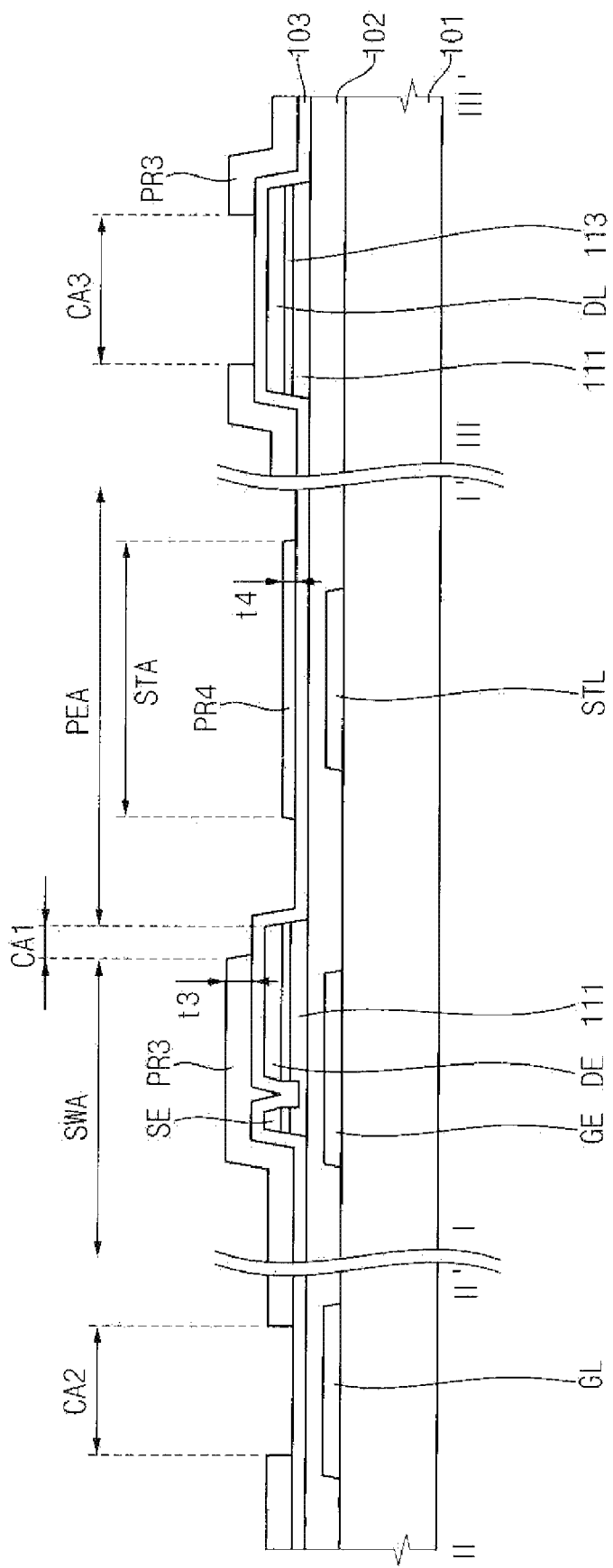

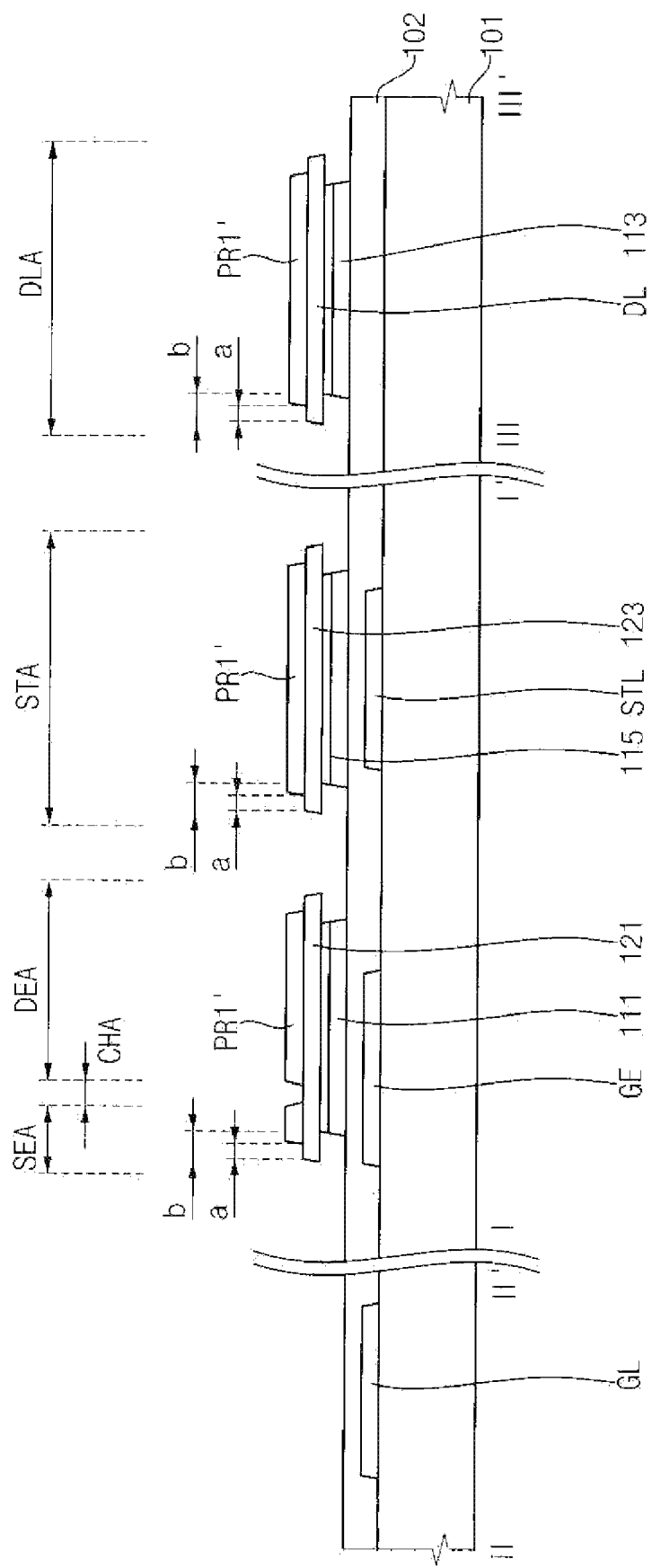

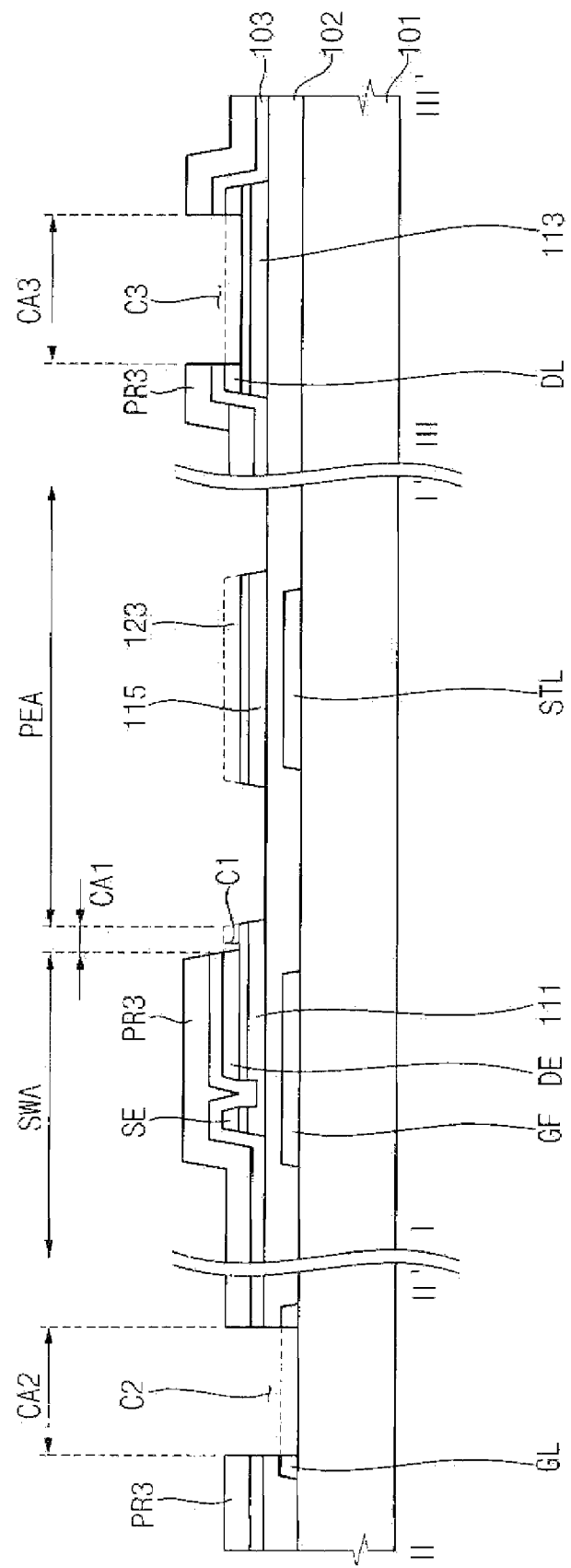

METHOD OF FORMING A METAL LINE AND METHOD OF MANUFACTURING A DISPLAY SUBSTRATE BY USING THE SAME INCLUDING ETCHING AND UNDERCUTTING THE CHANNEL LAYER

CROSS-REFERENCE TO RELATED APPLICATIONS

This application claims priority to Korean Patent Application No. 2006-36745 filed on Apr. 24, 2006, the contents of which are herein incorporated by reference in their entireties.

BACKGROUND OF THE INVENTION

1. Technical Field

The present invention relates to a display substrate, and more particularly, to a method of forming a metal line and a method of manufacturing a display substrate by using the method of formings a metal line.

2. Discussion of the Related Art

Generally, a liquid crystal display (LCD) device includes a display substrate and a counter substrate coupled to the display substrate to receive a liquid crystal layer. The display substrate has gate lines, source lines crossing the gate lines, switching elements connected to the gate and source lines, and pixel electrodes connected to the switching elements. Each switching element includes a gate electrode extending from the gate lines, a channel insulated from and overlapped with the gate electrode, a source electrode formed from the source lines and electrically connected to the channel, and a drain electrode spaced apart from the source electrode and electrically connected to the channel.

Masks are employed in manufacturing the display substrate. In order to reduce manufacturing time and cost, the number of the masks needed to manufacture the display substrate is minimized. For example, a five-mask process employs one mask during each of a gate metal patterning process, a channel patterning process, a source metal patterning process, a contact portion patterning process, and a pixel electrode patterning process, and thus a total of five masks may be employed. A four-mask process may be similar to the five-mask process described above however a single mask is used during both the channel patterning process and the source metal patterning process, and thus a total of four masks may be employed.

In display substrates manufactured by the four-mask process, a source metal pattern and a channel pattern are patterned by using one mask. Therefore, the channel pattern is formed more protrusive than the source metal pattern. Having a more protrusive channel pattern reduces an aperture ratio and changes a coupling capacitance between the channel pattern and the pixel electrode. This may be due to a light leaked current, thereby changing waterfall effect noise and driving characteristics of the switching element to incur some problems such as an afterimage.

SUMMARY OF THE INVENTION

Embodiments of the present invention provide a method of forming a metal line capable of improving display quality.

Embodiments of the present invention also provide a method of manufacturing a display substrate by using the above-mentioned method.

A method of forming a metal line in accordance with an embodiment of the present invention is provided as follows. A channel layer and a metal layer are successively formed on a base substrate. A photoresist pattern is formed in a wiring area. The metal layer is etched by using the photoresist pattern to form a metal line. The photoresist pattern is removed by a predetermined thickness to form a residual photoresist pattern on the metal line. The channel layer is etched by using the metal line to form an undercut under the metal line. The protruding portion of the metal line is removed by using the residual photoresist pattern. The formation of the undercut may produce the protruding portion.

A method of manufacturing a display substrate in accordance with an embodiment of the present invention is provided as follows. A channel layer and a source metal layer are successively formed on a base substrate having a gate line and a gate electrode of a switching element. A first photoresist pattern is formed in a source line area and a first area. A second photoresist pattern is formed in a second area. A source electrode and a drain electrode of the switching element are formed in the first area and a channel portion of the switching element is formed in the second area. Then, the source metal layer is patterned by using the first and second photoresist patterns to form an electrode metal pattern in the first and second areas and to form a source line in the source line area. A residual photoresist pattern is formed on the electrode metal pattern of the first area. The first and second photoresist patterns are removed by a predetermined thickness to expose the electrode metal pattern in the second area. The channel layer is etched using the electrode metal pattern and the source line to form undercuts under the electrode metal pattern and the source line. The electrode metal pattern is etched in the second area to form the source electrode and the drain electrode. A pixel electrode that is electrically connected to the drain electrode of the switching element is formed.

According to the above, a protruding portion of a channel pattern disposed under a source line, a source electrode and a drain electrode is removed. As a result, an aperture ratio may be increased, an afterimage may be prevented, and display quality may be improved.

BRIEF DESCRIPTION OF THE DRAWINGS

The above and other features of the present disclosure will become more apparent by describing exemplary embodiments thereof with reference to the accompanying drawings, in which:

FIGS. 2A to 2G are cross-sectional views illustrating a method of manufacturing a display substrate according to an exemplary embodiment of the present invention;

FIGS. 3A to 3D are cross-sectional views illustrating a method of manufacturing a display substrate according to an exemplary embodiment of the present invention; and FIGS. 4A to 4F are cross-sectional views illustrating a method of manufacturing a display substrate according to an exemplary embodiment of the present invention.

DETAILED DESCRIPTION OF THE EXEMPLARY EMBODIMENTS

Figure 1:
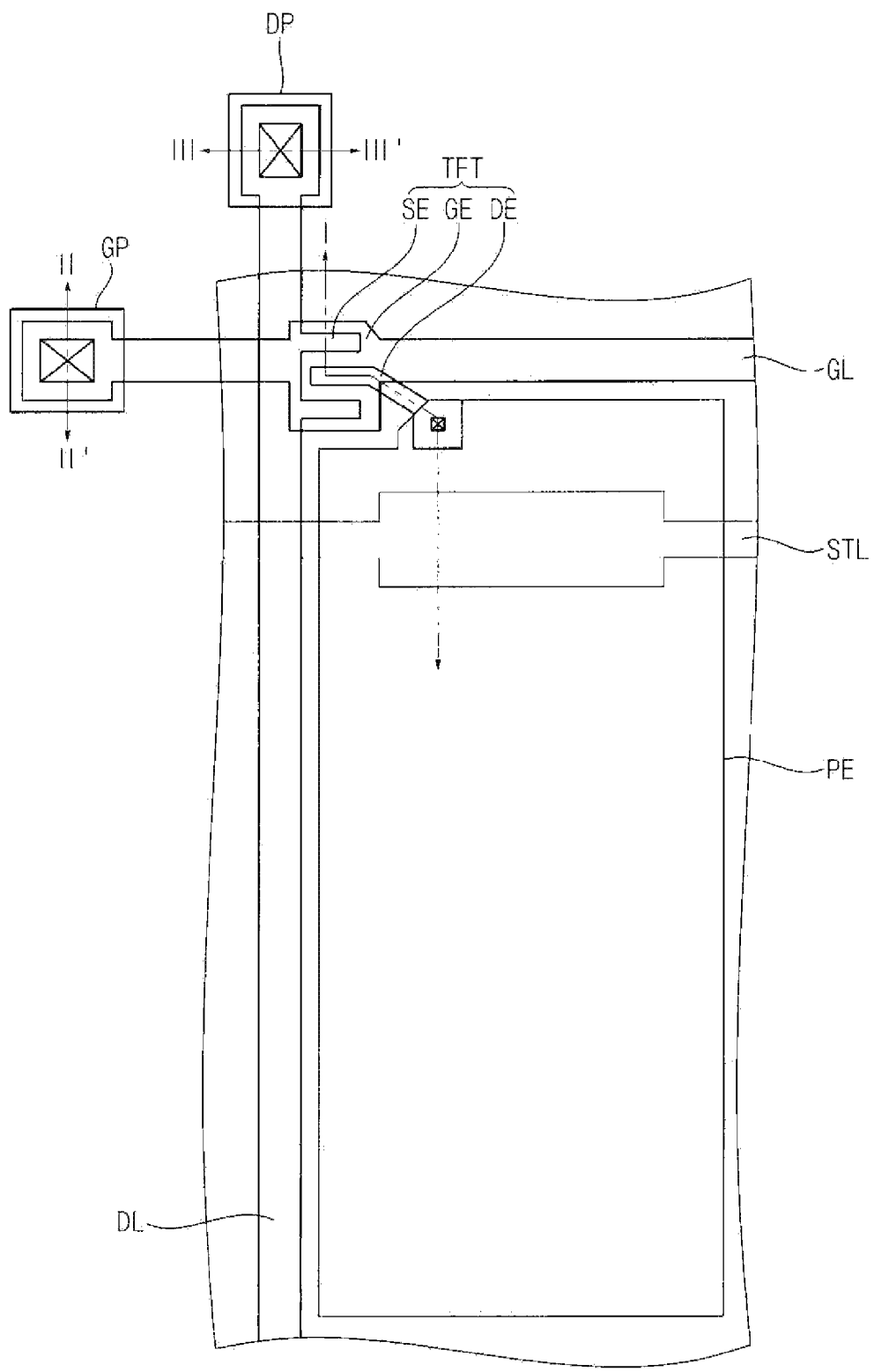
FIG. 1 is a plan view illustrating a display substrate according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

FIG. 1 is a plan view illustrating a display substrate according to an exemplary embodiment of the present invention. Lines I', II, II', III and III' are shown.

Referring to FIG. 1, a display substrate includes a plurality of gate lines GL, a plurality of source lines DL, a plurality of switching elements TFT, a plurality of pixel electrodes PD and a storage line STL.

The gate lines GL extends in a first direction. The gates lines GL may include at least one of a copper (Cu) group metal such as copper and copper alloy, an aluminum (Al) group metal such as aluminum and aluminum alloy, a molybdenum (Mo) group metal such as molybdenum and molybdenum alloy, chromium (Cr), tantalum (Ta), and titanium (Ti). The gates lines GL may have a single layer structure or a multiple layer structure.

A gate pad portion GP is formed at an end of each gate line GL. The gate pad portion GP includes a first pad pattern (not shown) electrically connected to the end of each gate line GL.

The source lines DL extend in a second direction crossing the first direction. The source lines DL may include at least one of a copper (Cu) group metal such as copper and copper alloy, an aluminum (Al) group metal such as aluminum and aluminum alloy, a molybdenum (Mo) group metal such as molybdenum and molybdenum alloy, chromium (Cr), tantalum (Ta), and titanium (Ti). The source lines DL may have a single layer structure or a multiple layer structure.

A source pad portion DP is formed at an end of each source line DL. The source pad portion DP includes a second pad pattern (not shown) electrically connected to the end of each source line DL.

Each switching element TFT is formed on one of a plurality of pixel portions P defined by the gate lines GL and the source lines DL. Each switching element TFT includes a gate electrode GE electrically connected to the corresponding gate line GL, a source electrode SE electrically connected to the corresponding source line DL, and a drain electrode DE spaced apart from the source electrode SE and electrically connected to the source electrode SE through a channel portion (not shown).

The pixel electrodes PE are electrically connected to the switching elements TFT. For example, each pixel electrode PE is electrically connected to the drain electrode DE of corresponding switching elements TFT. The pixel electrode PE may include a transparent and conductive material. Examples of the transparent and conductive material include, for example, oxide or nitride containing at least one selected from the group of indium (In), tin (Sn), zinc (Zn), aluminum (Al), gallium (Ga), etc.

The storage line STL overlaps the pixel electrode PE and receives a common voltage. The storage line STL and the pixel electrode PE define a storage capacitor. In an exemplary embodiment, a common type having the storage line STL is illustrated in FIG. 1. Alternatively, a storage line may be formed employing a previous gate type. The storage line of the common type is independently formed and receives a common voltage. The storage line of the previous gate type is connected to a previous gate line, and a gate-off voltage is applied to the previous gate line serves as a common voltage.

FIGS. 2A to 2G are cross-sectional views illustrating a method of manufacturing a display substrate according to a first exemplary embodiment of the present invention.

Figure 2A:
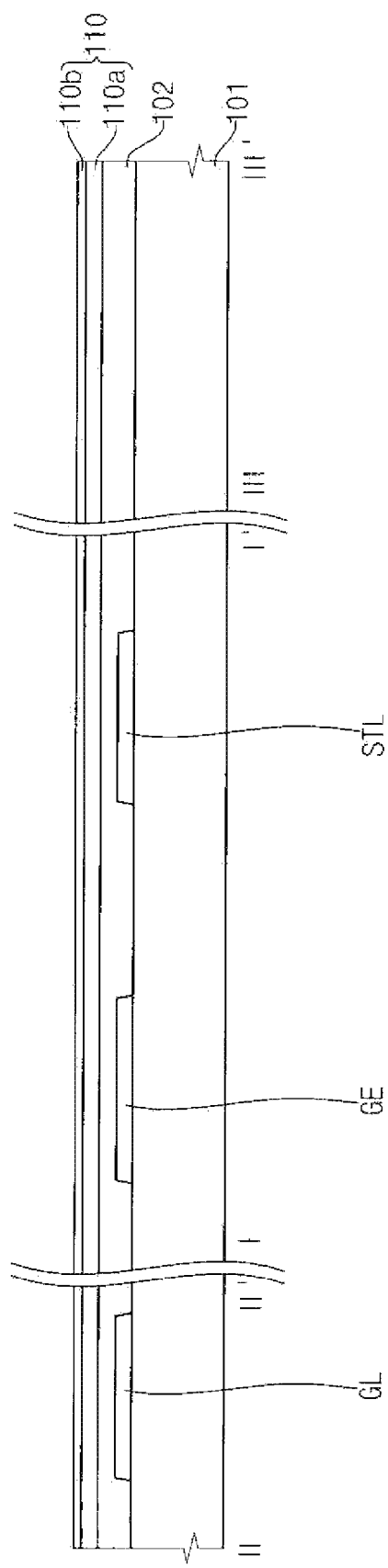

Referring to FIGS. 1 and 2A, a gate metal layer is deposited on a base substrate 101, and the gate metal layer is patterned by using a first photoresist pattern (not shown) to form the gate line GL, the gate electrode GE and the storage line STL. A gate insulation layer 102 is formed on the base substrate 101 having the gate line GL, the gate electrode GE and the storage line STL. A channel layer 110 is formed on the gate insulation layer 102. The channel layer 110 includes an active layer 110a having successively formed amorphous silicon (a-Si), and an ohmic contact layer 110b having amorphous silicon highly doped with n+ ions (n+ a-Si).

Referring to FIGS. 1 and 2B, a source metal layer (not shown) is deposited on the base substrate 101 having the channel layer 110 and a second photoresist pattern is formed on the source metal layer. The second photoresist pattern includes a first sub-photoresist pattern PR1, having a length 'L', formed in a source electrode area (SEA), a drain electrode area (DEA) and a source line area DLA and having a first thickness t1, and a second sub-photoresist pattern PR2 formed in a channel area CHA and having a second thickness t2. The second sub-photoresist pattern PR2 is patterned by using a slit mask or a halftone mask to have the second thickness t2 that is thinner than the first thickness t1.

The first sub-photoresist pattern PR1 may have an inclined angle θ1 of more than or equal to about 60 degrees, for example, 90 degrees. An inclined angle θ2 of a stepped portion between the first and second sub-photoresist patterns PR1 and PR2 may be about 60 degrees according to the process characteristics. The second thickness t2 may be controllable. For example, the second thickness t2 is smaller than or equal to about 5000 Å. The source metal layer is wet etched by using the first and second sub-photoresist patterns PR1 and PR2 to form an electrode metal pattern 121 and the source line DL.

Referring to FIGS. 1 and 2C, the first and second sub-photoresist patterns PR1 and PR2 are partially removed by a predetermined thickness through an etch back process to thereby form a first residual sub-photoresist patterns PR1' on the electrode metal pattern 121 and the source line DL. The first residual sub-photoresist patterns PR1' is formed to expose edge portions 'a' of the electrode metal pattern 121 and the source line DL, and expose the channel area CHA of the electrode metal pattern 121. Conditions of the etch back process may be controlled so that the exposed edge portions 'a' may have a length of smaller than or equal to about 0.5 µm.

In an exemplary embodiment, the first residual sub-photoresist patterns PR1' may be formed to expose the edge portions 'a' of the electrode metal pattern 121 and the source line DL. Alternatively, the first residual sub-photoresist patterns PR1' may be formed to extend to the edge portions 'a' of the electrode metal pattern 121 and the source line DL, and may be formed to partially cover the edge portions 'a' of the electrode metal pattern 121 and the source line DL. For example, a length of the edge portions 'a' may be smaller than or equal to about 0.5 µm. The channel layer 110 is patterned to form undercuts 'b' (refer to FIG. 2D), and the protruding channel layer 110 may be removed when the undercuts 'b' are longer than the edge portions 'a'. When the edge portions 'a' have a length of more than about 0.5 µm, the undercuts 'b' may have a relatively long length.

A decreased amount of a length 'L' of the first sub-photoresist pattern PR1 may be approximately equal to a decreased amount of the first thickness t1 of the first sub-photoresist pattern PR1 when the angle of incline θ1 of the first sub-photoresist pattern PR1 is about 45 degrees. The decreased amount of the length 'L' of the first sub-photoresist pattern PR1 may be smaller than the decreased amount of the first thickness t1 of the first sub-photoresist pattern PR1 when θ1 is more than 45 degrees. In contrast, the decreased amount of the length 'L' of the first sub-photoresist pattern PR1 is greater than the decreased amount of the first thickness t1 of the first sub-photoresist pattern PR1 at less than about 45 degrees of the inclined angle θ1 of the first sub-photoresist pattern PR1. The second photoresist pattern having the first and second sub-photoresist patterns PR1 and PR2 is partially removed through an etch back process in consideration of the decreased amount of the length 'L' of the first sub-photoresist pattern PR1 and the decreased amount of the first thickness t1 of the first sub-photoresist pattern PR1 at the inclined angle θ1 of the first sub-photoresist pattern PR1.

For example, in order for the length of the edge portions 'a' to be about equal to or less than 0.5 μm, the inclined angle θ1 of the first sub-photoresist pattern PR1 may be formed to have a range of about 60 degrees to about 90 degrees.

For example, the inclined angle θ1 of the first sub-photoresist pattern PR1 is about 45 degrees. In this case, when the first and second sub-photoresist patterns PR1 and PR2 are removed, a ration of the decreased amount of the length 'L' of the first sub-photoresist pattern PR1 to the decreased amount of the first thickness t1 of the first sub-photoresist pattern PR1 or the decreased amount of the second thickness t2 of the second sub-photoresist pattern PR2 may be about 1:1. Thus, when the second thickness t2 of the second sub-photoresist pattern PR2 is controlled, the length of the edge portions 'a' may also be controllable. For example, when the second thickness t2 of the second sub-photoresist pattern PR2 is smaller than or equal to about 5000 Å, the length of the edge portions 'a' may be less than or equal to about 0.5 μm.

Figure 2D:
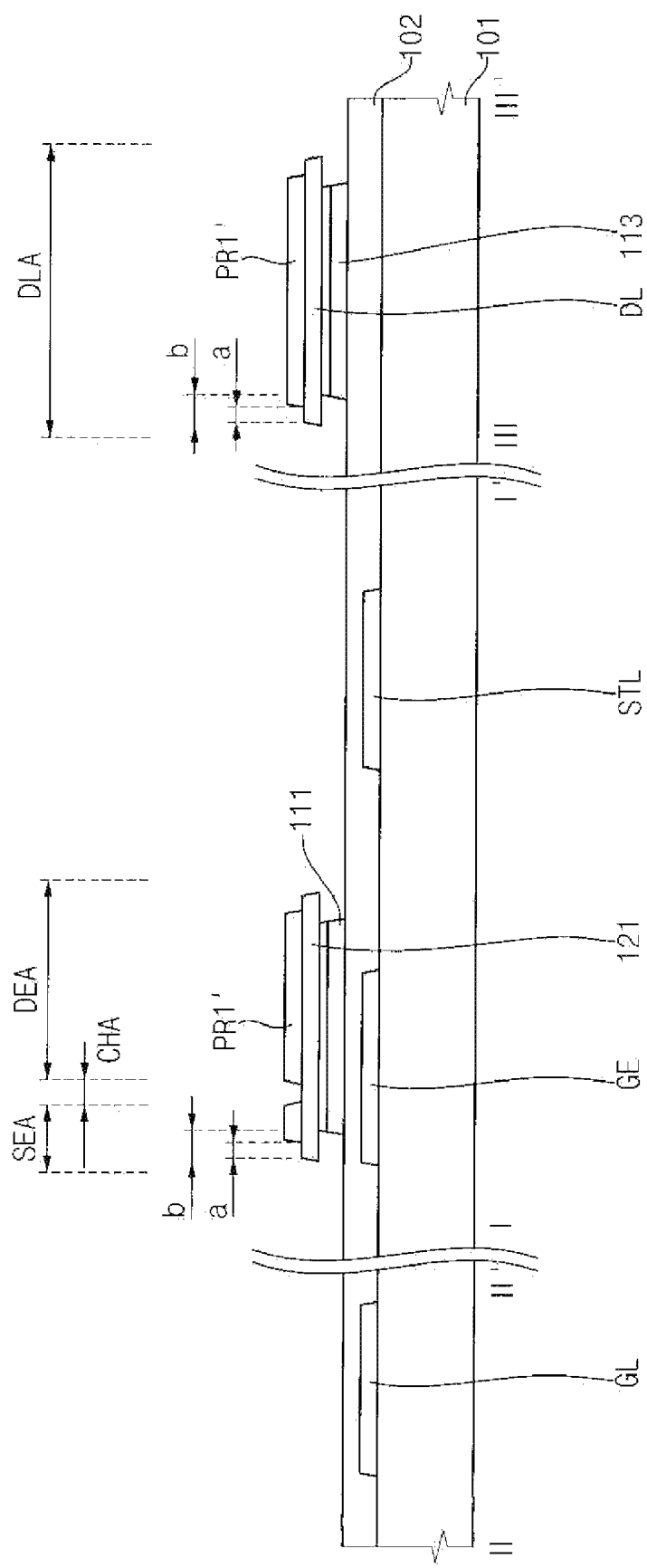

Referring to FIGS. 1 and 2D, the channel layer 110 formed under the electrode metal pattern 121 and the source line DL is dry etched. The channel layer 110 is isotropically dry etched to form the undercuts 'b' each having a predetermined length under the electrode metal pattern 121 and the source line DL.

For example, the channel layer 110 is isotropically dry etched by using $SF_6/Cl_2$ gas serving as a base in a plasma etch ("PE") process. An etch rate of the channel layer 110, for example, an amorphous silicon layer, may be set high, and an amount of over-etching may be increased. The amount of over-etching represents an amount of additional etching after the channel layer 110 is entirely removed and the gate insulation layer 102 is first exposed. When the amount of over-etching is increased under a condition of high etch rate of the amorphous silicon layer, the gate insulation layer 102 positioned under the channel layer 110 is not very well etched, but the amorphous silicon layer laterally positioned is etched to form the undercuts 'b'. When $SF_6/Cl_2$ gas is mixed with $O_2$ gas, a surface of the amorphous silicon layer is oxidized to SiOx, and thus etch rate of the amorphous silicon layer is reduced. Thus, $SF_6/Cl_2$ gas may include lower than about 20 percent of $O_2$ gas.

For example, a first channel pattern 111 is formed under the electrode metal pattern 121. The first channel pattern 111 is over-etched by about 0.5 μm to about 1 μm from an edge of the electrode metal pattern 121. A second channel pattern 113 is formed under the source line DL. The second channel pattern 113 is over-etched by about 0.5 μm to about 1 μm from an edge of the source line DL. In order to remove protruding portions of the first and second channel patterns 111 and 113, the length of the undercuts 'b' formed under the electrode metal pattern 121 may be greater than or equal to the length of the edge portions 'a'.

Referring to FIGS. 1 and 2E, due to the undercuts 'b', the electrode metal pattern 121 has a first protruding portion 131 that is more protrusive than the first channel pattern 111, and the source line DL has a second protruding portion 133 that is more protrusive than the second channel pattern 113.

The exposed portion of the electrode metal pattern 121 of the channel area CHA is removed through a dry etch process by using the first residual sub-photoresist pattern PR1' to thereby form the source electrode SE and the drain electrode DE of the switching element TFT. Since the first and second protruding portions 131 and 133 are removed, the source electrode SE, the drain electrode DE and the source line DL has an etched surface that is substantially the same or minutely more protrusive than the first and second channel patterns 111 and 113, respectively. For example, the source electrode SE, the drain electrode DE and the source line DL each have an etched surface that is substantially the same as the first and second channel patterns 111 and 113, respectively.

Through the dry etch process, when the electrode metal pattern 121 is removed, only the first and second protruding portions 131 and 133 are removed. In contrast, in a wet etch process, an etchant permeates between the first and second protruding portions 131 and 133 and the first and second channel patterns 111 and 113, to thereby etch the first and second protruding portions 131 and 133, and thus the first and second protruding portions 131 and 133 may remain.

In comparison with a conventional four mask process, a protrusive channel pattern is not formed under the source electrode SE, the drain electrode DE and the source line DL. Thus, aperture ratio reduction, afterimage defect, display quality deterioration, etc. may be prevented in embodiments of the present invention.

Then, a portion of the ohmic contact layer 110a, which is exposed by the source electrode SE and the drain electrode DE serving as a mask, is removed to form a channel portion CH of the switching element TFT.

Figure 2F:
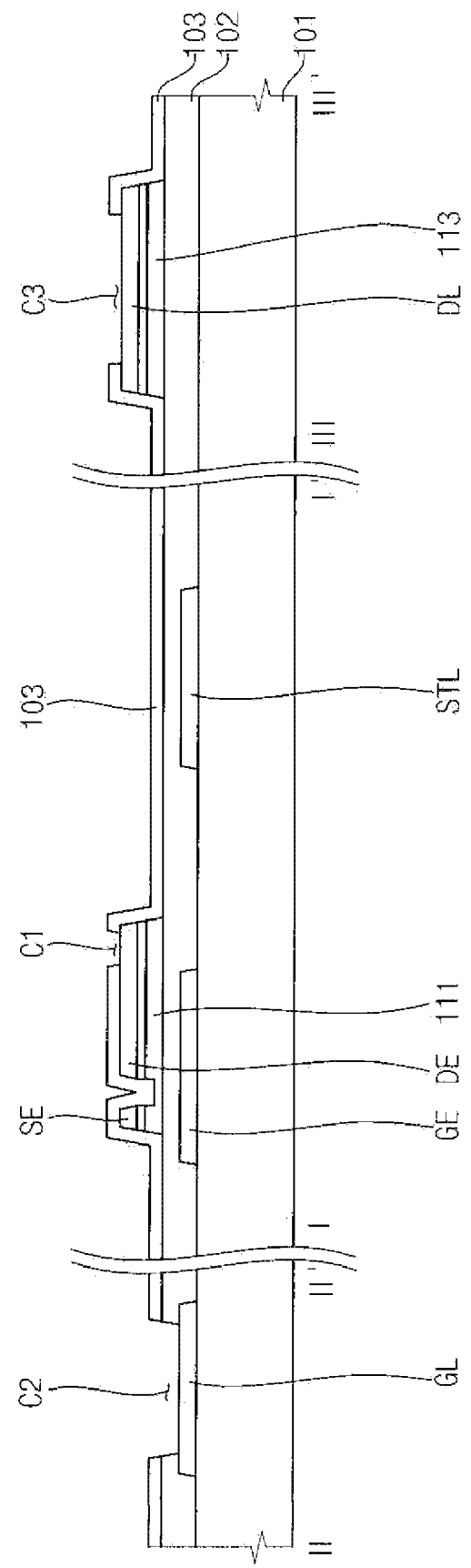

Referring to FIGS. 1 and 2F, a protective insulation layer 103 is formed on the base substrate 101 having the channel portion CH. Then, a third photoresist pattern (not shown) is formed on the base substrate 101 having the protective insulation layer 103. A first contact portion C1, a second contact portion C2 and a third contact portion C3 is formed by using the third photoresist pattern. The first contact portion C1 exposes the drain electrode DE, the second contact portion C2 exposes an end portion of the gate line GL, and the third contact portion C3 exposes an end portion of the source line DL.

Figure 2G:
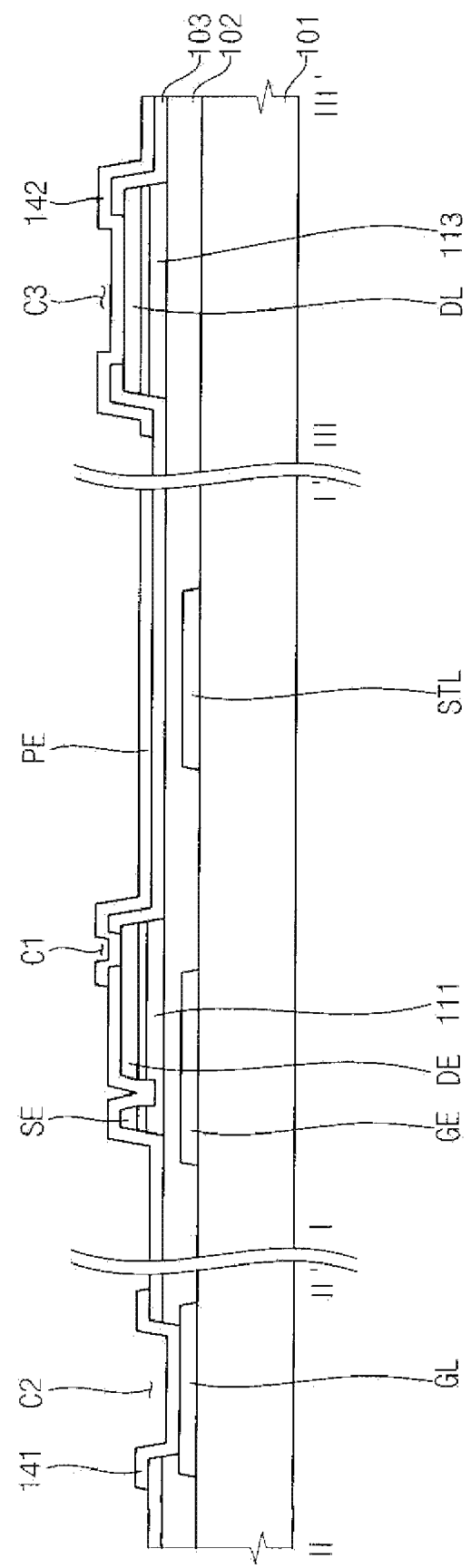

Referring to FIGS. 1 and 2G, a transparent electrode layer (not shown) is formed on the base substrate 101 having the first, second and third contact portions C1, C2 and C3. The transparent electrode layer makes contact with the drain electrode DE, the end portion of the gate line GL and the end portion of the source line DL through the first, second and third contact portions C1, C2 and C3, respectively.

The transparent electrode layer is patterned by using a fourth photoresist pattern (not shown) to form a pixel electrode PE electrically connected to the drain electrode DE, a first pad pattern 141 electrically connected to the end portion of the gate line GL and a second pad pattern 142 electrically connected to the end portion of the source line DL.

FIGS. 3A to 3D are cross-sectional views illustrating a method of manufacturing a display substrate according an exemplary embodiment of the present invention.

A gate line GL, a gate electrode GE and a storage line STL are formed by using the first photoresist pattern as described above. The source electrode SE, the drain electrode DE and the source line DL are formed by using the second photoresist pattern as described above. These steps, which are illustrated in the method of manufacturing a display substrate according to the exemplary embodiment of the present invention described in connection with FIGS. 2A-2G, are substantially the same as the method of manufacturing a display substrate according to the exemplary embodiment of the present invention described in connection with FIGS. 3A-3D. Hereinafter, processes after forming the protective insulation layer 103 on the base substrate 101 having the source electrode SE, the drain electrode DE and the source line DL will be described in detail with reference to the accompanying drawings, FIGS. 3A to 3D. The same reference numerals will be used to refer to the same parts.

Referring to FIGS. 1 and 3A, a third photoresist pattern is formed on the base substrate 101 having the protective insulation layer 103. The third photoresist pattern includes a third sub-photoresist pattern PR3 formed in a switching element area SWA having the switching element TFT and a wiring area (not shown), having the gate line GL and the source line DL, and a fourth sub-photoresist pattern PR4 formed in a storage area STA having the storage line STL. The third and fourth sub-photoresist patterns PR3 and PR4 have a third thickness t3 and a fourth thickness t4, respectively.

The fourth sub-photoresist pattern PR4 is patterned by using a slit mask or a halftone mask to have the fourth thickness t4 that is thinner than the third thickness t3.

The third photoresist pattern having the third and fourth sub-photoresist patterns PR3 and PR4 is not formed in a first contact area CA1 corresponding to an end portion of the drain electrode DE, a second contact area CA2 corresponding to an end portion of the gate line GL, and a third contact area CA3 corresponding to an end portion of the source line DL. Also, the third photoresist pattern having the third and fourth sub-photoresist patterns PR3 and PR4 is not formed in a pixel electrode area PEA except for the storage area STA.

Figure 3B:
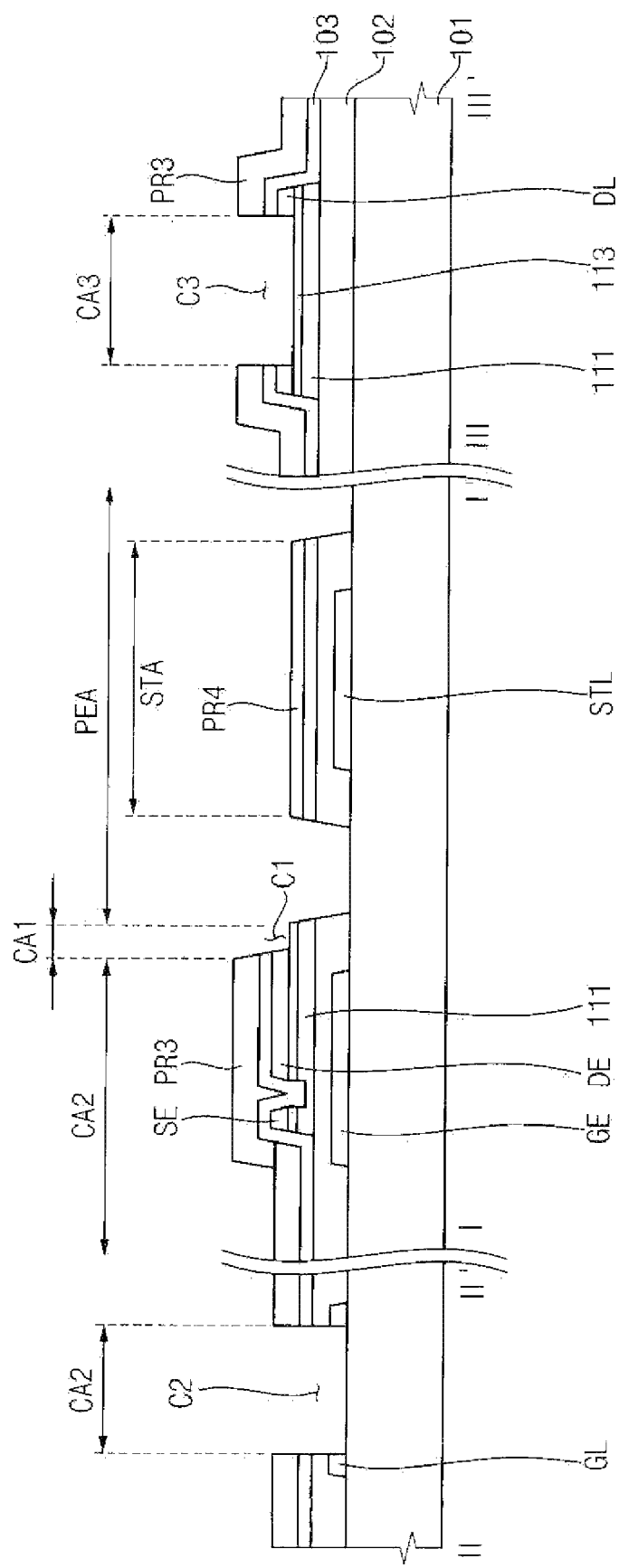

Referring to FIGS. 1 and 3B, the gate insulation layer 102 and the protective insulation layer 103 are removed through a first dry etch process by using the third photoresist pattern and by having the third and fourth sub-photoresist patterns PR3 and PR4 serve as a mask. Thus, a portion of the base substrate 101 corresponding to the pixel electrode area PEA except for the storage area STA is exposed. An end portion of the drain electrode DE, an end portion of the gate line GL, and an end portion of the source line DL are also exposed.

Then, the exposed end portion of the drain electrode DE, the exposed end portion of the gate line GL, and the exposed end portion of the source line DL are etched through a second dry etch process, to thereby form a first contact portion C1, a second contact portion C2 and a third contact portion C3.

Figure 3C:
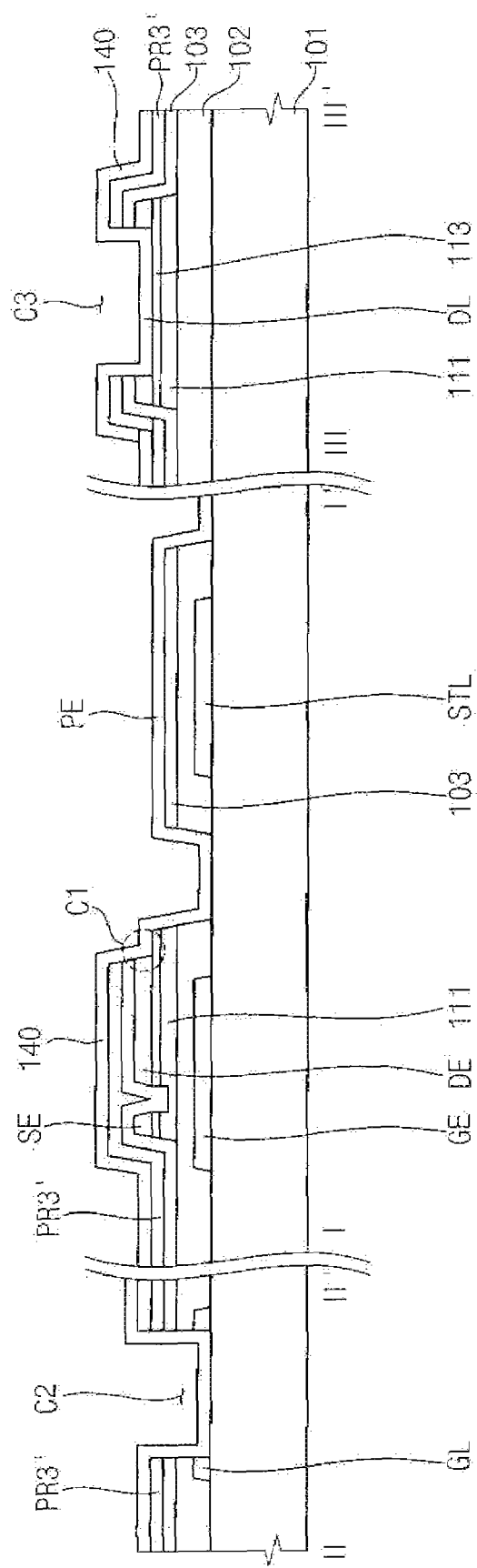

Referring to FIGS. 1 and 3C, the third photoresist pattern having the third and fourth sub-photoresist patterns PR3 and PR4 is partially removed through an etch back process. The fourth sub-photoresist pattern PR4 is removed to expose the protective insulation layer 103 over the storage line STL, and the third sub-photoresist pattern PR3 is removed by a predetermined thickness to form a second residual sub-photoresist pattern PR3' in the switching element area SWA and the wiring area (not shown).

A transparent electrode layer 140 is formed on the base substrate 101 having the second residual sub-photoresist pattern PR3'. The transparent electrode layer 140 makes contact with a side portion of the drain electrode DE by the first contact portion C1, a side portion of the gate line GL by the second contact portion C2, and a side portion of the source line DL by the third contact portion C3.

Figure 3D:
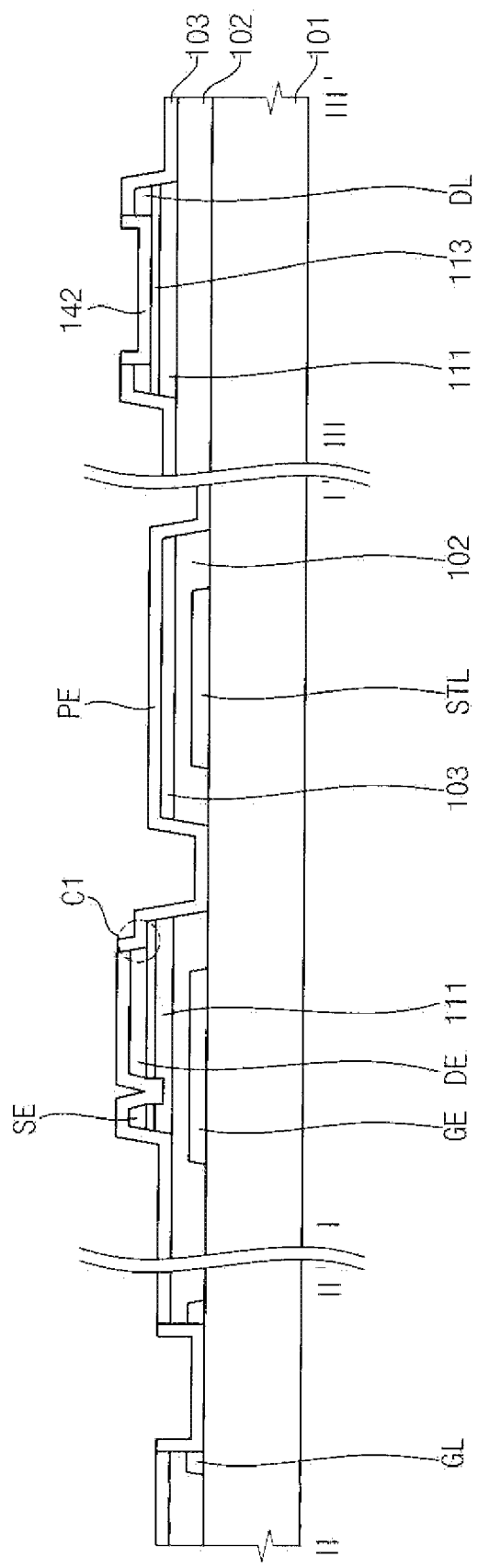

Referring to FIGS. 1 and 3D, the second residual sub-photoresist pattern PR3' is removed, for example, through a stripping process. Thus, the transparent electrode layer 140 is patterned to form a pixel electrode PE electrically connected to the drain electrode DE, a first pad pattern 141 electrically connected to the gate line GL and a second pad pattern 142 electrically connected to the source line DL.

FIGS. 4A to 4F are cross-sectional views illustrating a method of manufacturing a display substrate according to an exemplary embodiment of the present invention.

The method of manufacturing a display substrate according to the present embodiment of the present invention includes process steps that are described above with reference to the method of manufacturing a display substrate according to the exemplary embodiment of the present invention described in connection with FIGS. 2A-2G except for further including forming a cover metal pattern to cover the storage line STL during the process of forming the source electrode SE, the drain electrode DE and the source line DL, for example, by using the second photoresist pattern. The method of manufacturing a display substrate according to the present embodiment of the present invention further includes forming a protective insulation layer and a transparent electrode layer by using a third photoresist pattern, which is similar to the method of manufacturing a display substrate according to an exemplary embodiment of the present invention. Hereinafter, the method of manufacturing a display substrate according to the third exemplary embodiment of the present invention will be described with reference to the accompanying drawings, FIGS. 4A to 4D. The same reference numerals will be used to refer to the same parts.

Figure 4A:
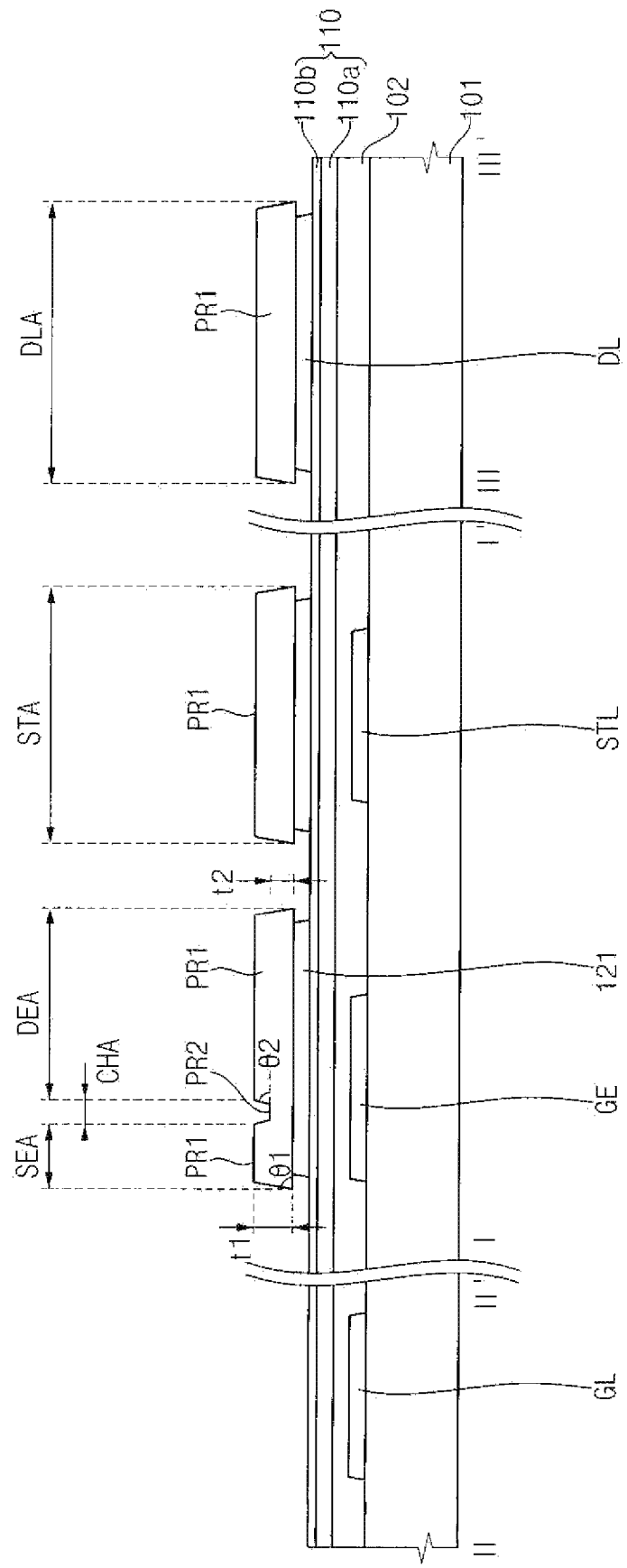

Referring to FIGS. 1 and 4A, a gate insulation layer 102 and a channel layer 110 is successively formed on the base substrate 101 having the gate line GL, the gate electrode GE and the storage line STL. A source metal layer (not shown) is formed on the base substrate 101 having the channel layer 110. A second photoresist pattern including a first sub-photoresist pattern PR1 and a second sub-photoresist pattern PR2 is formed on the source metal layer. The first sub-photoresist pattern PR1 is formed in the source electrode area SEA, the drain electrode area DEA, the storage area STA and the source line area DLA, and the second sub-photoresist pattern PR2 is formed in the channel area CHA.

Figure 4B:
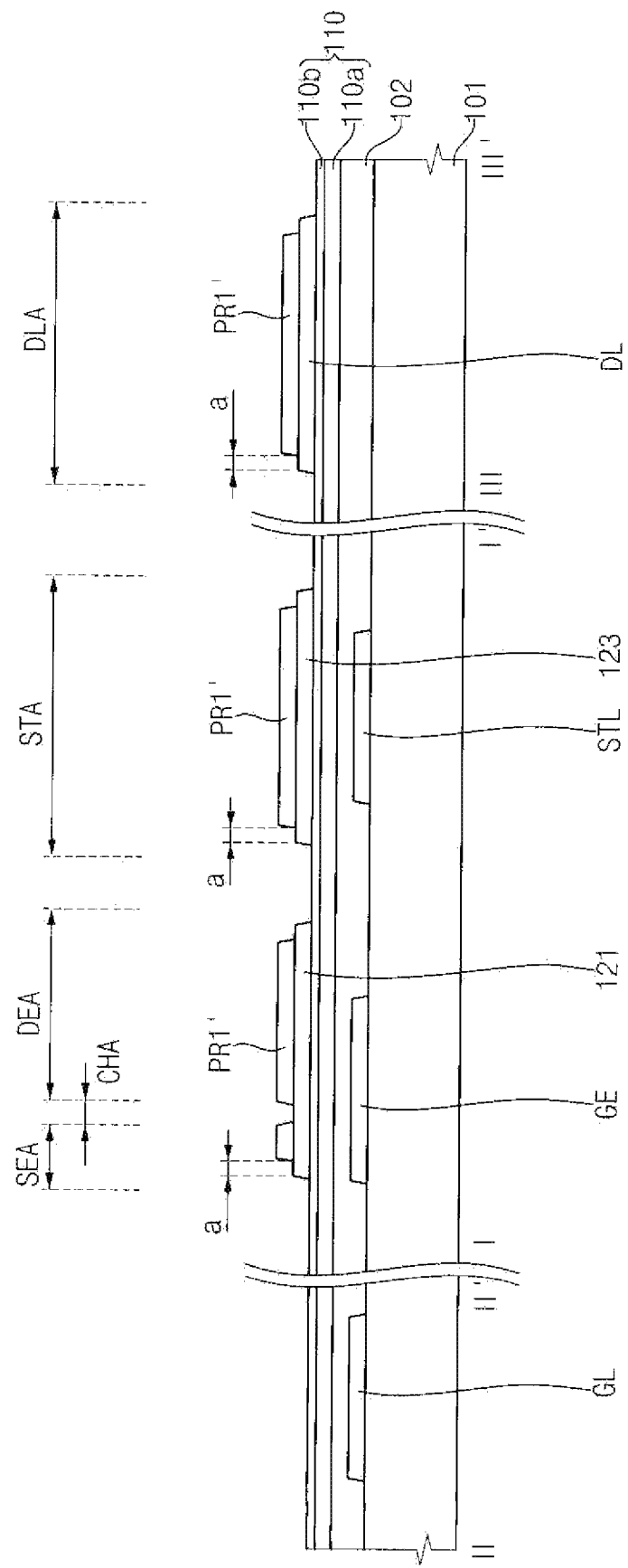

Referring to FIGS. 1 and 4B, the first and second sub-photoresist patterns PR1 and PR2 are partially removed by a predetermined thickness through an etch back process to thereby expose the electrode metal pattern 121 and form first residual sub-photoresist patterns PR1' on the electrode metal pattern 121, the source line DL and a cover electrode pattern 123. The first residual sub-photoresist patterns PR1' expose edge portions 'a' of the electrode metal pattern 121, the source line DL and the cover electrode pattern 123.

Referring to FIGS. 1 and 4C, the channel layer 110 is etched to form first, second and third channel patterns 111, 113 and 115 (respectively) having undercuts 'b' formed under the electrode metal pattern 121, the source line DL and the cover electrode pattern 123, respectively.

Figure 4D:
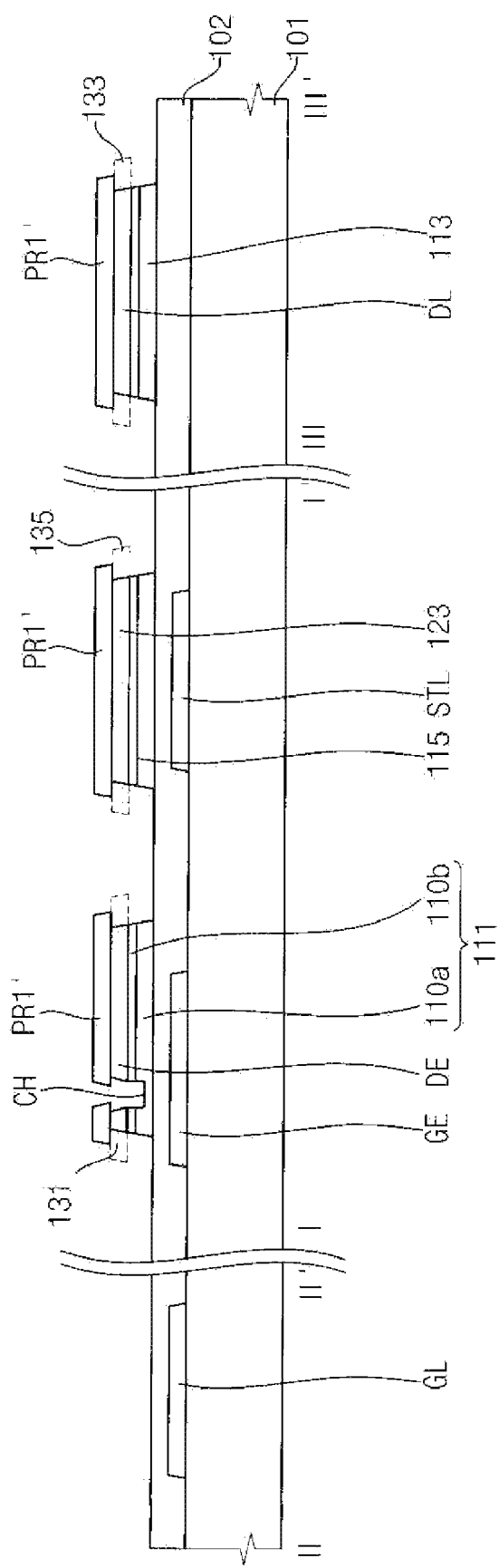

Referring to FIGS. 1 and 4D, due to the undercuts 'b', the electrode metal pattern 121, the source line DL and the cover electrode pattern 123 have first, second, and third protruding portions 131, 133 and 135 (respectively) that are more protrusive than the first, second and third channel patterns 111, 113 and 115, respectively.

The source electrode SE and the drain electrode DE are formed through an etch process by using the first residual sub-photoresist pattern PR1'. The first, second and third protruding portions 131, 133 and 135 (respectively) are removed to form the electrode metal pattern 121, the source line DL and the cover electrode pattern 123 having an etched surface that is substantially the same as the first, second and third channel patterns 111, 113 and 115, respectively.

Referring to FIGS. 1 and 4E, a protective insulation layer 103 is formed on the base substrate 101 having the source electrode SE, the drain electrode DE, the source line DL and the cover electrode pattern 123. A third photoresist pattern PR3 is formed on the base substrate 101 having the protective insulation layer 103. The third photoresist pattern PR3 is formed in a switching element area SWA having the switching element TFT and a wiring area (not shown) having the gate line GL and the source line DL.

The third photoresist pattern PR3 is not formed in a first contact area CA1 corresponding to an end portion of the drain electrode DE, a second contact area CA2 corresponding to an end portion of the gate line GL, a third contact area CA3 corresponding to an end portion of the source line DL or a pixel electrode area PEA having the pixel electrode PE.

The gate insulation layer 102 and the protective insulation layer 103 are removed through a first etch process by using the third photoresist pattern PR3 as a mask. Then, the end portion of the drain electrode DE, the end portion of the gate line GL and the end portion of the source line DL are etched through a second etch process to form first, second and third contact portions C1, C2 and C3 (respectively). The cover metal pattern 123 is removed through the second etch process to expose the third channel pattern 115 over the storage line STL.

Figure 4F:
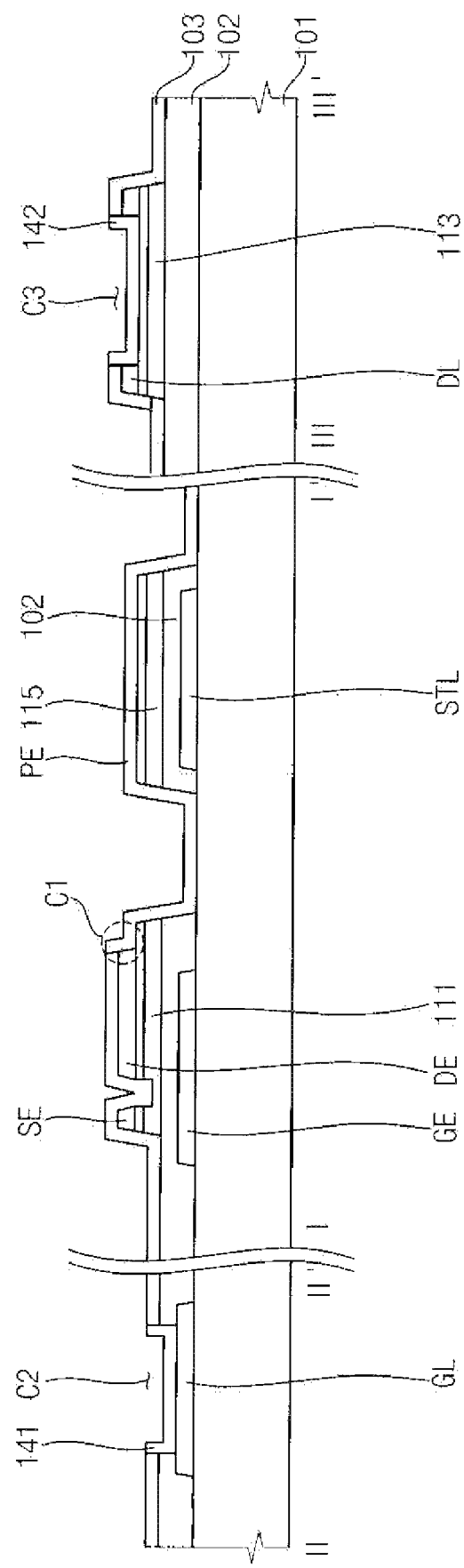

Referring to FIGS. 1 and 4F, a transparent electrode layer (not shown) is formed on the base substrate 101 having a first, second and third contact portions C1, C2 and C3 (respectively). Then, the third photoresist pattern PR3 is removed through a stripping process. Thus, the transparent electrode layer is patterned to form the pixel electrode PE electrically connected to the drain electrode DE, a first pad pattern 141 electrically connected to the gate line GL and a second pad pattern 142 electrically connected to the source line DL.

According to embodiments of the present invention, in a process of forming a source line by using one mask with respect to a source metal layer and a channel layer formed under the source metal layer, a channel layer that is more protrusive than the source line is removed. Thus, the display quality may be improved.

For example, a protruding portion of the channel layer under the source line is removed to improve an aperture ratio and simplify a minute wiring process. A coupling capacitance is not generated between a pixel electrode and the channel layer to thereby remove a waterfall noise and prevent an afterimage defect.

Although exemplary embodiments of the present invention have been described, it is understood that the present invention should not be limited to these exemplary embodiments but various changes and modifications can be made by one ordinary skilled in the art within the spirit and scope of the present invention.

What is claimed is:

1. A method of forming a metal line, comprising:
   forming a channel layer on a base substrate;
   forming a metal layer on the formed channel layer;
   forming a photoresist pattern in a wiring area of the metal layer;
   etching the metal layer by using the photoresist pattern to form a metal line;
   removing a predetermined thickness of the photoresist pattern to form a residual photoresist pattern on the metal line;
   etching the channel layer by using the metal line to form an undercut under the metal line and to cause a protruding portion of the metal line to protrude relative to the channel layer; and
   removing the protruding portion of the metal line by using the residual photoresist pattern.

2. The method of claim 1, wherein the channel layer is isotropically dry etched.

3. The method of claim 1, wherein the undercut has a length of about 0.5 µm to about 1 µm.

4. The method of claim 1, wherein the protruding portion of the metal line is removed through a dry etching process.

5. The method of claim 1, wherein the residual photoresist pattern is formed on the metal line to expose an edge portion of the metal line, and a length of the undercut is longer than or equal to a length of the exposed edge portion.

6. The method of claim 5, wherein the exposed edge portion has a length of less than or equal to about 0.5 µm.

7. The method of claim 5, wherein the undercut has a length of about 0.5 µm to about 1 µm.

8. The method of claim 5, wherein the protruding portion of the metal line is removed through a dry etching process.

9. The method of claim 1, wherein the residual photoresist pattern is formed on the metal line to expose an edge portion of the metal line, and wherein the exposed edge portion has a length of less than or equal to about 0.5 µm, and the undercut has a length of about 0.5 µm to about 1 µm.

10. A method of manufacturing a display substrate, comprising:
    forming a channel layer on a base substrate, the substrate having a gate line and a gate electrode of a switching element;
    forming a source metal layer on the formed channel layer;
    forming a first photoresist pattern on the source metal layer in a source line area and a first area, wherein a source electrode and a drain electrode of the switching element is formed in the first area;
    forming a second photoresist pattern on the source metal layer in a second area, wherein a channel portion of the switching element is formed in the second area;
    patterning the source metal layer by using the first and second photoresist patterns to form an electrode metal pattern in the first and second areas and a source line in the source line area;
    forming a residual photoresist pattern on the electrode metal pattern of the first area, and removing the first and second photoresist patterns by a predetermined thickness to expose the electrode metal pattern in the second area;
    etching the channel layer by using the electrode metal pattern and the source line to form undercuts under the electrode metal pattern and the source line;
    etching the electrode metal pattern in the second area to form the source electrode and the drain electrode; and
    forming a pixel electrode electrically connected to the drain electrode of the switching element.

11. The method of claim 10, wherein the first photoresist pattern has an inclined angle of about 60 degrees to about 90 degrees with respect to the base substrate.

12. The method of claim 11, wherein the second photoresist pattern has a thickness of about 5000 Å.

13. The method of claim 10, wherein the residual photoresist pattern is formed on the electrode metal pattern and the source line to expose edge portions of the electrode metal pattern and the source line, and a length of the undercuts is greater than or equal to a length of the edge portions.

14. The method of claim 10, wherein the channel layer is isotropically dry etched.

15. The method of claim 10, further comprising removing protruding portions of the electrode metal pattern and the source line by using the residual photoresist pattern, the protruding portions protruding in relation to the undercuts.

16. The method of claim 15, wherein the protruding portion of the electrode metal pattern is removed through a dry etching process.

17. The method of claim 10, wherein forming the source electrode and the drain electrode comprises selectively etching the channel layer by using the source electrode and the drain electrode to form the channel portion.

18. The method of claim 10, further comprising forming the gate line, the gate electrode and a storage line on the base substrate.

19. The method of claim 18, wherein forming the pixel electrode comprises:
    forming a protective insulation layer on the base substrate having the switching element;
    forming a third photoresist pattern on areas having the switching element, the gate line and the source line;
    removing a portion of the protective insulation layer corresponding to an area that has the pixel electrode and includes an end portion of the drain electrode by using the third photoresist pattern;
    forming a transparent electrode layer on the base substrate having a remaining portion of the protective insulation layer; and
    removing the third photoresist pattern and patterning the transparent electrode layer to form the pixel electrode to make contact with the end portion of the drain electrode.

20. The method of claim 19, further comprising simultaneously:
    forming a cover metal pattern covering the storage line with the source line; and
    removing the cover metal pattern with the protective insulation layer.

21. The method of claim 10, wherein the residual photoresist pattern is formed on the electrode metal pattern and the source line to expose edge portions of the electrode metal pattern and the metal line, and wherein each of the exposed edge portions has a length of less than or equal to about 0.5 μm, and each of the undercuts has a length of about 0.5 μm to about 1 μm.

* * * * *